(12) United States Patent
Barak et al.

(10) Patent No.: US 9,465,060 B2
(45) Date of Patent: Oct. 11, 2016

(54) APPARATUS AND METHOD FOR MEASURING TEMPERATURE AND ELECTRICAL RESISTIVITY OF A MOVABLE OBJECT

(71) Applicant: GM GLOBAL TECHNOLOGY OPERATIONS LLC, Detroit, MI (US)

(72) Inventors: Menashe Barak, Haifa (IL); Mario Jodorkovsky, Nesher (IL)

(73) Assignee: GM Global Technology Operations LLC, Detroit, MI (US)

( * ) Notice: Subject to any disclaimer, the term of this patent is extended or adjusted under 35 U.S.C. 154(b) by 561 days.

(21) Appl. No.: 13/899,944

(22) Filed: May 22, 2013

(65) Prior Publication Data

US 2014/0348206 A1 Nov. 27, 2014

(51) Int. Cl.
| | |
|---|---|
| *G01K 1/08* | (2006.01) |
| *G01R 27/02* | (2006.01) |
| *G01K 7/04* | (2006.01) |
| *G01K 13/06* | (2006.01) |
| *G01R 1/04* | (2006.01) |
| *G01R 11/02* | (2006.01) |

(52) U.S. Cl.
CPC ............... *G01R 27/02* (2013.01); *G01K 7/04* (2013.01); *G01K 13/06* (2013.01); *G01R 1/0408* (2013.01)

(58) Field of Classification Search
USPC ............ 702/156; 324/136; 374/179, E7.004, 374/E1.018
See application file for complete search history.

(56) References Cited

U.S. PATENT DOCUMENTS

| | | | | | |
|---|---|---|---|---|---|
| 3,725,835 | A | * | 4/1973 | Hopkins | G11B 21/12 337/140 |
| 6,459,855 | B1 | * | 10/2002 | Kosaka | G03B 9/08 396/176 |
| 7,184,901 | B1 | * | 2/2007 | Chiang | G01R 27/02 702/57 |
| 7,259,567 | B2 | * | 8/2007 | Sears | G01R 31/045 324/508 |
| 2007/0175213 | A1 | * | 8/2007 | Featherstone | F03G 7/065 60/527 |
| 2008/0271559 | A1 | * | 11/2008 | Garscha | F03G 7/065 74/469 |
| 2009/0312984 | A1 | * | 12/2009 | Delajoud | G01D 18/00 702/183 |

* cited by examiner

*Primary Examiner* — Lisa Caputo
*Assistant Examiner* — Nasir U Ahmed
(74) *Attorney, Agent, or Firm* — Quinn Law Group, PLLC

(57) ABSTRACT

An apparatus for connecting an electrical measurement system, which includes at least a first and a second conductor, to a movable object to measure at least one of a temperature and an electrical resistivity of the movable object includes a first and a second connector, and a first and a second contact wire. The first and the second contact wires are electrically communicable with the first and the second conductors, respectively, and are wound around at least a portion of the first and the second connectors, respectively, such that the first and the second contact wires are engageable with the movable object at a first and a second contact point, respectively. The first and the second contact wires each has a polarity. The first and the second connectors are made of a material having a higher electrical and thermal resistivity than the first and the second contact wires.

18 Claims, 2 Drawing Sheets

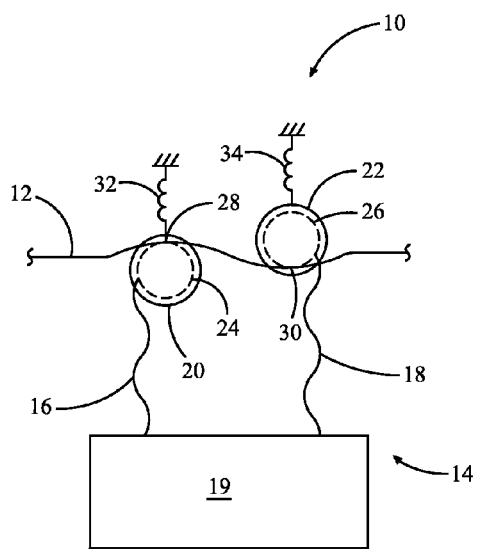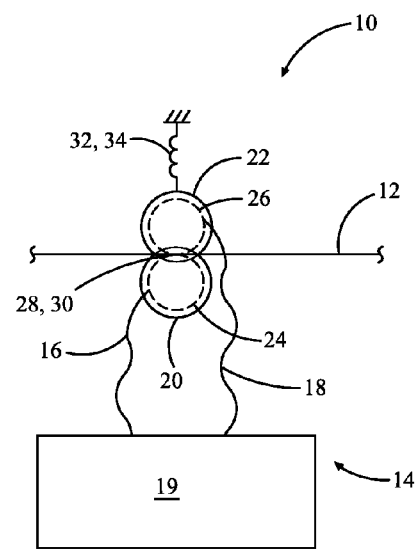
FIG. 1A    FIG. 1B
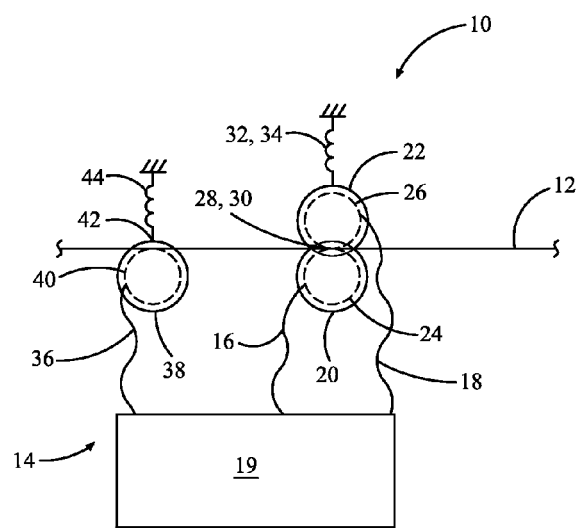
FIG. 2

APPARATUS AND METHOD FOR MEASURING TEMPERATURE AND ELECTRICAL RESISTIVITY OF A MOVABLE OBJECT

TECHNICAL FIELD

The present invention relates to an apparatus, a system, and a method for measuring temperature and/or electrical resistivity of a movable object.

BACKGROUND

Many different objects are utilized in electrical or automation systems in which it may be frequently desired to measure their temperature and/or resistivity. In some applications, a current is supplied through the objects for Joule heating. Often, the objects are in motion during operation due to various factors, including, but not limited to, property changes.

One such object is a shape memory alloy (SMA) wire that is increasingly being incorporated in such control devices as actuators, sensors, and the like. An SMA wire generally exhibits pseudo-elastic characteristics when it is cooled below a certain temperature at which a material crystal phase transformation occurs. In this phase, the wire will reversibly elongate under an applied stress. When heated above another temperature, the material also changes its crystal phase and contracts back to its original shape. It is often desirable to measure such properties as the temperature and/or the resistivity in order to monitor the crystal changes and to maximize their performance with this information.

SUMMARY

An apparatus for connecting an electrical measurement system to a movable object to measure at least one of a temperature and an electrical resistivity of the movable object is provided. The electrical measurement system generally includes at least a first conductor and a second conductor. The apparatus includes a first connector and a second connector, each of which is rotatable about a fixed axis.

The apparatus also includes a first contact wire and a second contact wire that are electrically communicable with the first conductor and the second conductor, respectively. The first contact wire is wound around at least a portion of the first connector such that the first contact wire is in contact with the movable object at a first contact point. Similarly, the second contact wire is wound around at least a portion of the second connector such that the second contact wire is in contact with the movable object at a second contact point. The first contact wire and the second contact wire each have a polarity. The first connector and the second connector are made of a material having a higher electrical and thermal resistivity than the first contact wire and the second contact wire.

When simultaneously measuring the temperature and the electrical resistivity of the movable object, the first connector and the second connector may be staggered such that there is a distance between the first contact point and the second contact point along the movable object. In addition, the first contact wire and the second contact wire may be made of thermocouple metals having different polarities.

When measuring only the electrical resistivity, the first connector and the second connector also may be staggered as with the simultaneous measuring of the temperature and the electrical resistivity. However, the first contact wire and the second contact wire may have the same polarities.

When measuring only the temperature, the first connector and the second connector may be positioned on opposing sides of the movable object such that the first contact point and the second contact point are at substantially the same location along the movable object. As with the simultaneous measuring of the temperature and the electrical resistivity, the first conductor and the second conductor may have different polarities.

A method of measuring at least one of a temperature and a resistivity of a movable object via an electrical measurement system connected to the movable object via the apparatus described above is also provided. As explained above, the electrical measurement system includes at least a first conductor and a second conductor. The method includes first connecting the first conductor and the second conductor to the first contact wire and to the second contact wire, respectively.

The method then includes positioning the first connector and the second connector such that the first contact wire and the second contact wire are in contact with the movable object at a first contact point and a second contact point, respectively.

As explained above, when simultaneously measuring the temperature and the electrical resistivity of the movable object, or measuring only the electrical resistivity, the first connector and the second connector may be staggered such that there is a distance between the first contact point and the second contact point along the movable object. When measuring only the temperature, the first connector and the second connector may be positioned on opposing sides of the movable object such that the first contact point and the second contact point are at substantially the same location along the movable object.

The method finally includes determining, by the electrical measurement system, at least one of the temperature and the electrical resistivity of the movable object.

The above features and advantages, and other features and advantages, of the present invention are readily apparent from the following detailed description of some of the best modes and other embodiments for carrying out the invention, which is defined solely by the appended claims, when taken in connection with the accompanying drawings.

BRIEF DESCRIPTION OF THE DRAWINGS

FIG. 1A is a schematic, block diagram of an apparatus in a first configuration for connecting an electrical measurement system to a movable object according to one embodiment of the present invention;

FIG. 1B is a schematic, block diagram of the apparatus of FIG. 1A in a second configuration;

FIG. 2 is a schematic, block diagram of an apparatus for connecting an electrical measurement system to a movable object according to another embodiment of the present invention;

DETAILED DESCRIPTION

Figure 3:
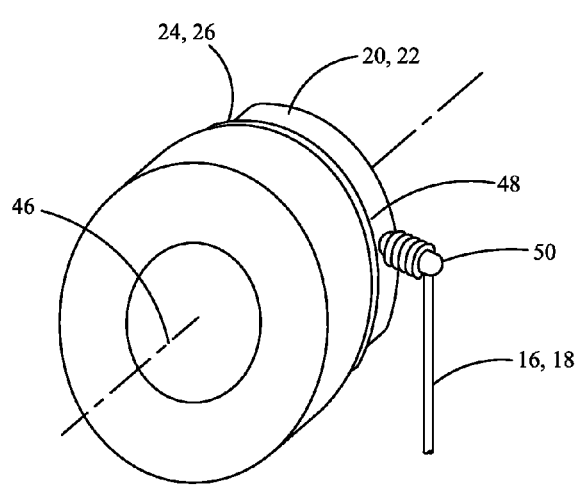
FIG. 3 is a schematic, perspective view of an exemplary connector and contact wire of the apparatus of FIGS. 1A and 1B connected to a conductor of the electrical measurement system.

Those having ordinary skill in the art will recognize that terms such as "above," "below," "upward," "downward," et cetera, are used descriptively of the figures, and do not represent limitations on the scope of the invention, as defined by the appended claims. Any numerical designations, such as "first" or "second" are illustrative only and are not intended to limit the scope of the invention in any way.

Referring to the drawings, wherein like reference numbers correspond to like or similar components wherever possible throughout the several figures, an apparatus 10 for connecting an electrical measurement system 14 to a movable object 12 is shown in FIGS. 1A and 1B. The electrical measurement system 14 generally is utilized to measure different properties of the movable object 12 at a specific location along the movable object 12. The properties may include, but are not limited to, temperature and electrical resistivity. The measurements may be determined simultaneously or individually, as described in more detail hereinafter.

The movable object 12 generally is any object that may have a temperature and/or an electrical resistivity, such as when a current is flowing through it. For example, the movable object 12 may be a very thin wire. However, it should be appreciated that it may be any other object that may have a temperature and/or an electrical resistivity, including, but not limited to, a cable, a plate, a strip, or the like. In addition, the movable object 12 generally may be movable during its operation. For example, where the movable object 12 is a wire made of a shape memory alloy (SMA), it may elongate and contract when it is cooled and heated, respectively. Such an application may be used as an actuator (not shown), such as that used in a vehicle (not shown), replacing conventional motors.

The electrical measurement system 14 generally includes a first conductor 16 and a second conductor 18. The electrical measurement system 14 may also include an electrical component 19 to which the first conductor 16 and the second conductor 18 are connected. The electrical component 19 may be configured to receive and/or transmit a current through the first conductor 16 and the second conductor 18.

The first conductor 16 and the second conductor 18 may be easily disconnected or dislodged from the movable object 12 in a harsh environment that has much movement and vibration, such as in a vehicle. The apparatus 10 provides a secure and reliable connection for the first conductor 16 and the second conductor 18 to the movable object 12 such that the measurement(s) of the different properties of the movable object 12 may be taken.

The apparatus 10 generally includes a first connector 20, a second connector 22, a first contact wire 24, and a second contact wire 26. The first contact wire 24 and the second contact wire 26 are electrically communicable with the first conductor 16 and the second conductor 18 of the electrical measurement system 14, as depicted in FIG. 3. This allows a current to flow between the first conductor 16 and the first contact wire 24, and between the second conductor 18 and the second contact wire 26. The first contact wire 24 and the second contact wire 26 each have a polarity. The polarities may be different or may be the same, depending upon the measurement(s) to be taken by the electrical measurement system 14, as described in more detail hereinafter.

Figure 4:
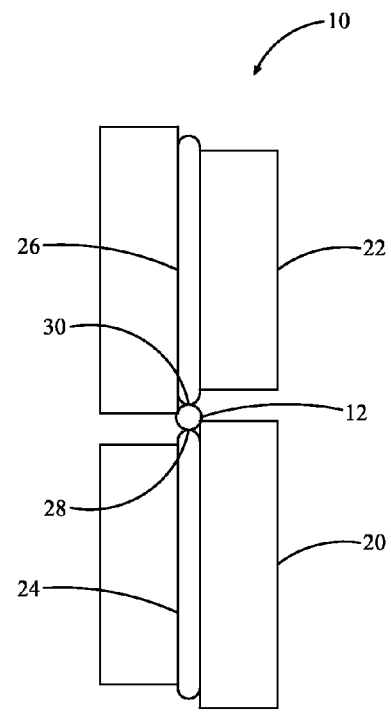
FIG. 4 is a schematic, side view of the apparatus of FIGS. 1B and 2.

The first contact wire 24 is wound around at least a portion of the first connector 20 such that the first contact wire 24 is engageable with the movable object 12 at a first contact point 28. Similarly, the second contact wire 26 is wound around at least a portion of the second connector 22 such that the second contact wire 26 is engageable with the movable object 12 at a second contact point 30. Generally, the first contact wire 24 and the second contact wire 26 are arranged such that they are not in significant contact with the second connector 22 and the first connector 20, respectively, as depicted in FIG. 4. The first contact wire 24 and the second contact wire 26 may be thin wires having a small diameter. This may minimize the contact area of the first contact point 28 and the second contact point 30, thereby minimizing thermal conduction errors due to heat conduction leakage.

The first connector 20 and the second connector 22 generally are any objects that are rotatable about a fixed axis 46, including, but not limited to, wheels, as depicted in FIG. 3. As explained above, the movable object 12 generally may be movable when in operation, such as with a SMA wire. The ability of the first connector 20 and the second connector 22 to rotate about a fixed axis 46 allows the first contact point 28 and the second contact point 30 to be maintained while the movable object 12 is in motion without producing significant constant friction at the first contact point 28 and the second contact point 30. Such friction may wear the contact wires 24 and 26 and the movable object 12, as well as disrupt the motion of the movable object 12. The first connector 20 and the second connector 22 generally are made of a material having a higher electrical and thermal resistivity than that of the first contact wire 24 and the second contact wire 26. In one embodiment, the electrical and thermal resistivity of the first connector 20 and the second connector 22 may be at least three or four orders of magnitude higher than that of the first contact wire 24 and the second contact wire 26.

Referring now to FIG. 3, an exemplary connector 20, 22 and contact wire 24, 26 in electrical communication with a conductor 16, 18 is shown. The connector 20, 22 may have a channel 48 in which the contact wire 24, 26 may fit such that it may be securely wound around at least a portion of the connector 20, 22, as explained above. In addition, the connector 20, 22 may also have a pin 50 protruding from a side of the connector 20, 22. The contact wire 24, 26 and the conductor 16, 18 may be wound around the pin 48 such that they are in electrical communication with each other, as explained above. It should be appreciated that other methods may be utilized to connect the contact wire 24, 26 and the conductor 16, 18.

Referring back to FIGS. 1A and 1B, the first connector 20 and the second connector 22 may be connected to a first spring-loaded anchor 32 and a second spring-loaded anchor 34, respectively. This may allow the positions of the first connector 20 and the second connector 22 to be adjusted both vertically and horizontally, as well as to allow the system 10 to be utilized in a harsh environment as described above.

The positioning of the first connector 20 and the second connector 22 may be dependent upon the measurement(s) intended to be taken. As explained above, the temperature and the electrical resistivity of the movable object 12 may be determined simultaneously or individually. When simultaneously measuring the temperature and the electrical resistivity, or measuring only the electrical resistivity, the first connector 20 and the second connector 22 may be in a first configuration, as depicted in FIG. 1A. When measuring only the temperature, the first connector 20 and the second connector 22 may be in a second configuration, as depicted in FIG. 1B.

In the first configuration, the first connector 20 and the second connector 22 are staggered such that there is a distance between the first contact point 28 and the second contact point 30 along the movable object 12. The stagger may be in a horizontal direction and/or a vertical direction. The distance between the first contact point 28 and the second contact point 30 allows there to be a voltage drop across the distance when a current is passing through the movable object 12, as mentioned above. The voltage drop is then sensed by the contact wires 24 and 26, and then is relayed by the conductors 16 and 18 to the electrical component 19. The current may be used to raise the temperature of the movable object 12, or may be a distinct excitation current generated by the electrical component 19 or introduced to the movable object 12 by an external source (not shown).

In addition, the staggering of the first connector 20 and the second connector 22 may create a contact arc in the movable object 12. This type of contact may provide a minimal contact area between the first contact wire 24 and the second contact wire 26 with the movable object 12 that is sufficient electrically to allow current to flow between them, while minimizing heat conduction leakage from the movable object 12. The amount of stagger and the distance between the first connector 20 and the second connector 22 dictate the contact arc length in the movable object 12, as well as the amount of friction imposed on the movable object 12. The first spring-loaded anchor 32 and the second spring-loaded anchor 34 may be used to adjust these parameters, as explained above. While FIG. 1A depicts the first connector 20 and the second connector 22 on opposite sides of the movable object 12, it should be appreciated that they may be on the same side of the movable object 12.

Furthermore, when the first connector 20 and the second connector 22 are in the first configuration, the first contact wire 24 and the second contact wire 26 may have different polarities or the same polarity, depending upon the desired measurement(s). When simultaneously measuring the temperature and the electrical resistivity, the first contact wire 24 and the second contact wire 26 have different polarities. In such a scenario, the first contact wire 24 and the second contact wire 26 may be thermocouple metals, including, but not limited to, chromel and constantan. However, when measuring only the electrical resistivity, the first contact wire 24 and the second contact wire 26 may be made of any conducting material, including, but not limited to, thermocouple metals, and may have the same or different polarities.

In the second configuration, the first connector 20 and the second connector 22 are positioned on opposing sides of the movable object 12 such that the first contact point 28 and the second contact point 30 are at substantially the same location along the movable object 12. Unlike the first configuration, the staggering of the first connector 20 and the second connector 22 is unnecessary because the first contact wire 24 and the second contact wire 26 spontaneously generate a voltage difference between them, which is proportional to the temperature difference between the movable object 12 and the electrical component 19. However, it should be appreciated that the temperature may still be determined if there is a distance between the first contact point 28 and the second contact point 30. In addition, as with the simultaneous measuring of the temperature and the electrical resistivity, the first contact wire 24 and the second contact wire 26 have different polarities.

Referring now to FIG. 2, the electrical measurement system 14 may include a third conductor 36. As such, the apparatus 10 may include a third connector 38 and a third contact wire 40. As with the first connector 20 and the second connector 22, the third connector 38 is rotatable about an axis, and has an electrical and thermal resistivity greater than the third contact wire 40. In addition, similar to the first contact wire 24 and the second contact wire 26, the third contact wire 40 is electrically communicable with the third conductor 36, and is wound around at least a portion of the third connector 38 such that the third contact wire 40 is engageable with the movable object 12 at a third contact point 42. The third contact wire 40 has a polarity that is the same as at least one of the first contact wire 24 and the second contact wire 26. The third connector 38 generally may be positioned with respect to the first connector 20 and the second connector 22 such that the third contact point 42 is spaced a distance from the first contact point 28 and the second contact point 30. The third connector 38 also may be connected to a third spring-loaded anchor 44.

The third conductor 36, the third connector 38, and the third contact wire 40 enable the apparatus 10 to switch between the first configuration and the second configuration. This may allow the electrical measurement system 14 to measure any one of the temperature and the electrical resistivity simultaneously, only the temperature, or only the electrical resistivity without having to move the first connector 20 and/or the second connector 22, or to switch the polarities of the first contact wire 24 and/or the second contact wire 26.

Figure 5:
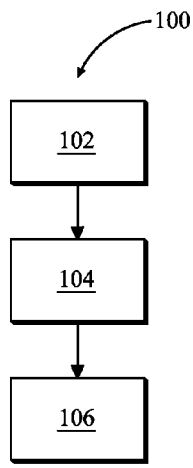
FIG. 5 is a schematic, flow diagram illustrating a method of measuring the temperature and/or the electrical resistivity of the movable object.

Referring now to FIG. 5, a method 100 for measuring at least one of the temperature and the electrical resistivity of the movable object 12 via the electrical measurement system 14 and the apparatus 10 is shown.

Method 100 begins at step 102 in which the first conductor 16 and the second conductor 18 are connected electrically to the first contact wire 24 and the second contact wire 26, respectively. As explained above, the first contact wire 24 and the second contact wire 26 may be wound around pins 50 of the first connector 20 and the second connector 22, respectively. As such, step 102 may include winding at least a portion of the first conductor 16 and the second conductor 18 around the pins 50 of the first connector 20 and the second connector 22, respectively, such that the first conductor 16 and the second conductor 18 are in electrical communication with the first contact wire 24 and the second contact wire 26.

After step 102, method 100 proceeds to step 104. At step 104, the first connector 20 and the second connector 22 are positioned such that the first contact wire 24 and the second contact wire 26 are in contact with the movable object 12 at a first contact point 24 and a second contact point 26, respectively. As explained above, the respective positions of the first connector 20 and the second connector 22 may be dependent upon the desired measurement(s).

As explained above, the first connector 20 and the second connector 22 are in the first configuration when it is desired to simultaneously measure the temperature and the electrical resistivity, or to measure only the electrical resistivity, and in the second configuration when it is desired to measure only the temperature. Also as explained above, in the first configuration, the first connector 20 and the second connector 22 are staggered such that there is a distance between the first contact point 28 and the second contact point 30 in at least one of a horizontal direction and a vertical direction. In the second configuration, the first connector 20 and the second connector 22 are positioned on opposing sides of the movable object 12 such that the first contact point 28 and the second contact point 30 are at substantially the same location along the movable object 12.

Method 100 ends at step 106. At step 106, the temperature and/or the electrical resistivity of the movable object 12 is determined. The determination may be made by the electrical measurement system 14.

The detailed description and the drawings or figures are supportive and descriptive of the invention, but the scope of the invention is defined solely by the claims. While some of the best modes and other embodiments for carrying out the claimed invention have been described in detail, various alternative designs and embodiments exist for practicing the invention defined in the appended claims.

The invention claimed is:

1. An apparatus for connecting an electrical measurement system to a movable object to measure at least one of a temperature and an electrical resistivity of the movable object, the electrical measurement system having at least a first conductor and a second conductor, the apparatus comprising:
   a first connector and a second connector each rotatable about a fixed axis;
   a first contact wire electrically communicable with the first conductor, the first contact wire being wound around at least a portion of the first connector such that the first contact wire is engageable with the movable object at a first contact point; and
   a second contact wire electrically communicable with the second conductor, the second contact wire being wound around at least a portion of the second connector such that the second contact wire is engageable with the movable object at a second contact point;
   wherein the first contact wire and the second contact wire each have a polarity; and
   wherein the first connector and the second connector are each made of a material having higher electrical and thermal resistivity than the first contact wire and the second contact wire.

2. The apparatus of claim 1 wherein the first connector and the second connector are wheels.

3. The apparatus of claim 1 wherein the first connector and the second connector are staggered such that there is a distance between the first contact point and the second contact point along the movable object when simultaneously measuring the temperature and the electrical resistivity of the movable object, or measuring only the electrical resistivity.

4. The apparatus of claim 3 wherein the first contact wire and the second contact wire are made of thermocouple metals having different polarities when simultaneously measuring the temperature and the electrical resistivity.

5. The apparatus of claim 4 wherein the first contact wire is made of chromel and the second contact wire is made of constantan.

6. The apparatus of claim 3 wherein the first contact wire and the second contact wire have the same polarity when measuring only the electrical resistivity.

7. The apparatus of claim 1 wherein the first connector is positioned above the second connector such that the first contact point and the second contact point are at substantially the same location on the movable object when measuring only the temperature of the movable object.

8. The apparatus of claim 7 wherein the first contact wire and the second contact wire have different polarities.

9. The apparatus of claim 1 further comprising a third connector and a third contact wire electrically communicable with a third conductor of the electrical measurement system, the third contact wire being wound around at least a portion of the third connector such that the third contact wire is engageable with the movable object at a third contact point, the third contact point being spaced a distance from the first contact point and the second contact point, the third contact wire having a polarity that is the same as that of one of the first contact wire and the second contact wire.

10. The apparatus of claim 1 wherein the first connector comprises a pin around which at least a portion of the first contact wire and at least a portion of the first conductor are wound such that they are in electrical communication with each other, and wherein the second connector comprises a pin around which at least a portion of the second contact wire and at least a portion of the second conductor are wound such that they are in electrical communication with each other.

11. The apparatus of claim 1 wherein the first connector and the second connector each have a channel in which the first contact wire and the second contact wire, respectively, sit.

12. The apparatus of claim 1 wherein at least one of the first connector and the second connector is attached to a spring-loaded anchor.

13. A method of connecting an electrical measurement system to a movable object to measure at least one of a temperature and an electrical resistivity of the movable object via an apparatus having a first contact wire wound around at least a portion of a first connector, and a second contact wire wound around at least a portion of a second connector, the electrical measurement system having at least a first conductor and a second conductor, the method comprising:
   connecting the first conductor and the second conductor to the first contact wire and the second contact wire, respectively;
   positioning the first connector and the second connector such that the first contact wire and the second contact wire are in contact with the movable object at a first contact point and a second contact point, respectively; and
   wherein the first contact wire and the second contact wire each have a polarity; and
   wherein the first connector and the second connector each are rotatable about a fixed axis, and each are made of a material having a higher electrical and thermal resistivity than the first contact wire and the second contact wire.

14. The method of claim 13 wherein the positioning of the first connector and the second connector comprises staggering the first connector and the second connector such that there is a distance between the first contact point and the second contact point along the movable object when simultaneously measuring the temperature and the electrical resistivity of the movable object, or measuring only the electrical resistivity.

15. The method of claim 14 wherein the first contact wire and the second contact wire are made of thermocouple wires having different polarities when simultaneously measuring the temperature and the electrical resistivity.

16. The method of claim 14 wherein the first contact wire and the second contact wire have the same polarities when measuring only the electrical resistivity.

17. The method of claim 16 wherein the first contact wire and the second contact wire have different polarities.

18. The method of claim 13 wherein the positioning of the first connector and the second connector comprises positioning the first connector and the second connector on opposing sides of the movable object such that the first contact point and the second contact point are at substantially the same location along the movable object when measuring only the temperature of the movable object.

* * * * *